(12) United States Patent
Kwon et al.

(10) Patent No.: US 6,633,335 B1
(45) Date of Patent: Oct. 14, 2003

(54) CMOS IMAGE SENSOR WITH TESTING CIRCUIT FOR VERIFYING OPERATION THEREOF

(75) Inventors: Oh Bong Kwon, Ichon-shi (KR); Woodward Yang, Ichon-shi (KR); Suk Joong Lee, Ichon-shi (KR); Gyu Tae Hwang, Ichon-shi (KR)

(73) Assignee: Hyundai Electronics Industries Co., Ltd., Ichon-shi (JP)

( * ) Notice: Subject to any disclaimer, the term of this patent is extended or adjusted under 35 U.S.C. 154(b) by 0 days.

(21) Appl. No.: 09/258,448

(22) Filed: Feb. 26, 1999

(30) Foreign Application Priority Data

Feb. 28, 1998 (KR) ............................................. 98-6686

(51) Int. Cl.⁷ .......................... H04N 3/14; H04N 5/335; H03M 1/10; H03M 1/56
(52) U.S. Cl. ........................ 348/308; 348/302; 341/120; 341/169
(58) Field of Search ................................ 341/120, 169; 348/308, 302

(56) References Cited

U.S. PATENT DOCUMENTS

| | | | |
|---|---|---|---|
| 4,839,729 A | * 6/1989 | Ando et al. | 348/241 |
| 5,381,175 A | 1/1995 | Sudo et al. | 348/246 |
| 5,461,425 A | 10/1995 | Fowler et al. | 348/294 |
| 5,471,515 A | 11/1995 | Fossum et al. | 377/60 |
| 5,521,640 A | 5/1996 | Prater | 348/273 |
| 5,539,461 A | 7/1996 | Andoh et al. | 348/308 |
| 5,631,704 A | 5/1997 | Dickinson et al. | 348/308 |
| 5,654,537 A | 8/1997 | Prater | 250/208.1 |
| 5,657,019 A | * 8/1997 | Hunt et al. | 341/120 |
| 5,665,959 A | 9/1997 | Fossum et al. | 250/208.1 |
| 5,793,322 A | 8/1998 | Fossum et al. | 341/161 |
| 5,841,126 A | 11/1998 | Fossum et al. | 250/208.1 |
| 5,877,715 A | 3/1999 | Gowda et al. | 341/122 |
| 5,880,691 A | 3/1999 | Fossum et al. | 341/162 |
| 5,883,830 A | 3/1999 | Hirt et al. | 365/185.03 |
| 5,892,541 A | 4/1999 | Merrill | 348/302 |
| 6,118,482 A | * 9/2000 | Clark et al. | 348/308 |

FOREIGN PATENT DOCUMENTS

| | | | | |
|---|---|---|---|---|
| GB | 2140995 A | 12/1984 | | H03K/13/32 |
| WO | WO 97/24728 | 7/1997 | | G11C/7/00 |

* cited by examiner

*Primary Examiner*—Andrew Christensen
*Assistant Examiner*—Tia M. Harris
(74) *Attorney, Agent, or Firm*—Jacobson Holman PLLC

(57) ABSTRACT

The present invention relates to a picture display using CMOS (Complementary Metal Oxide Semiconductor) image sensor; and, more particularly, to a CMOS image sensor having a testing circuit embedded therein and a method for verifying operation of the CMOS image sensor using the testing circuit. The CMOS image sensor according to the present invention includes a control/interface unit for controlling its operation sensor using a state machine and for interfacing the CMOS image sensor with an external system; a pixel array including a plurality of pixels sensing images from an object and generating analogue signals according to an amount of incident light; a converter for converting the analogue signals into digital signals to be processed in a digital logic circuit; and a testing circuit for verifying operations of the converter and the control/interface unit, by controlling the converter.

23 Claims, 9 Drawing Sheets

TEST MODE REGISTER

| 7 | 6 | 5 | 4 | 3 | 2 | 1 | 0 |
|---|---|---|---|---|---|---|---| bit[1:0] : 00=Normal Mode
01=Test_A Mode
10=Test_B Mode
11=Test_C Mode
bit[7:2] : 00000(Reserved)

CMOS IMAGE SENSOR WITH TESTING CIRCUIT FOR VERIFYING OPERATION THEREOF

FIELD OF THE INVENTION

The present invention relates to a picture display using CMOS (Complementary Metal Oxide Semiconductor) image sensor; and, more particularly, to a CMOS image sensor having a testing circuit embedded therein and a method for verifying operation of the CMOS image sensor using the testing circuit.

DESCRIPTION OF THE PRIOR ART

Generally, an image sensor is an apparatus to capture images using light sensing semiconductor materials. Since brightness and wavelength of light from an object has different amounts according to the reflection area, electrical signals from pixels are different from one another. These electrical signals are converted into digital signals, which can be processed in a digital circuit, by an analogue-to-digital converter.

Conventional displays employing charge coupled devices (hereinafter, referred to as CCDs) are in need of relatively high voltage and many processing steps are required to implement such a charge coupled device. An image sensor implemented by the charge coupled devices should have separate logic circuits for converting the analogue signals into the digital signals. Furthermore, in the conventional CCD image sensor, it is very difficult to integrate the sensors and the logic circuits in a chip.

SUMMARY OF THE INVENTION

It is, therefore, an object of the present invention to provide a CMOS image sensor capable of being driven in a low power using a CMOS technology.

It is another object of the present invention to provide a CMOS image sensor in which sensors and all logic circuits are integrated in a chip with a fast data processing and a large integration.

It is further another object of the present invention to provide a CMOS image sensor with a test logic circuit for verifying its operation and a method for verifying the CMOS image sensor.

In accordance with an aspect of the present invention, there is provided a CMOS image sensor comprising: a control and interface means for controlling the CMOS image sensor using a state machine and for interfacing the CMOS image sensor with an external system; a pixel array including a plurality of pixels sensing images from an object and generating analogue signals according to an amount of incident light; a conversion means for converting the analogue signals into digital signals to be processed in a digital logic circuit; and a logic circuit for testing operations of the conversion means and the control and interface means, by controlling the conversion means.

In accordance with another aspect of the present invention, there is provided a CMOS image sensor having a pixel array to output analogue signals sensed from an object, the CMOS image sensor comprising: an analogue-to-digital converter including: a) a voltage generator for generating a first reference voltage; b) a comparison means for comparing the analogue signals with the reference voltage; and c) a storage means for storing digital signals in response to outputs from the comparison means; and a logic circuit for detecting whether the analogue-to-digital converter operates erroneously or not, wherein the logic circuit operates in response to test mode information stored in a mode register which the CMOS image sensor has, controls the voltage generator for the comparison means to receive a second reference to voltage and a test voltage and stores in the storage means digital signals produced in response to a control signal from the comparison means, and wherein the storage means outputs the stored digital signals to an output terminal of the CMOS image sensor.

BRIEF DESCRIPTION OF THE DRAWINGS

The above and other objects and feature of the present invention will become apparent from the following description of preferred embodiments given in connection with the accompanying drawings, in which.

DETAILED DESCRIPTION OF THE PREFERRED EMBODIMENTS

Hereinafter, the present invention will be described in detail referring to the accompanying drawings.

Figure 1:
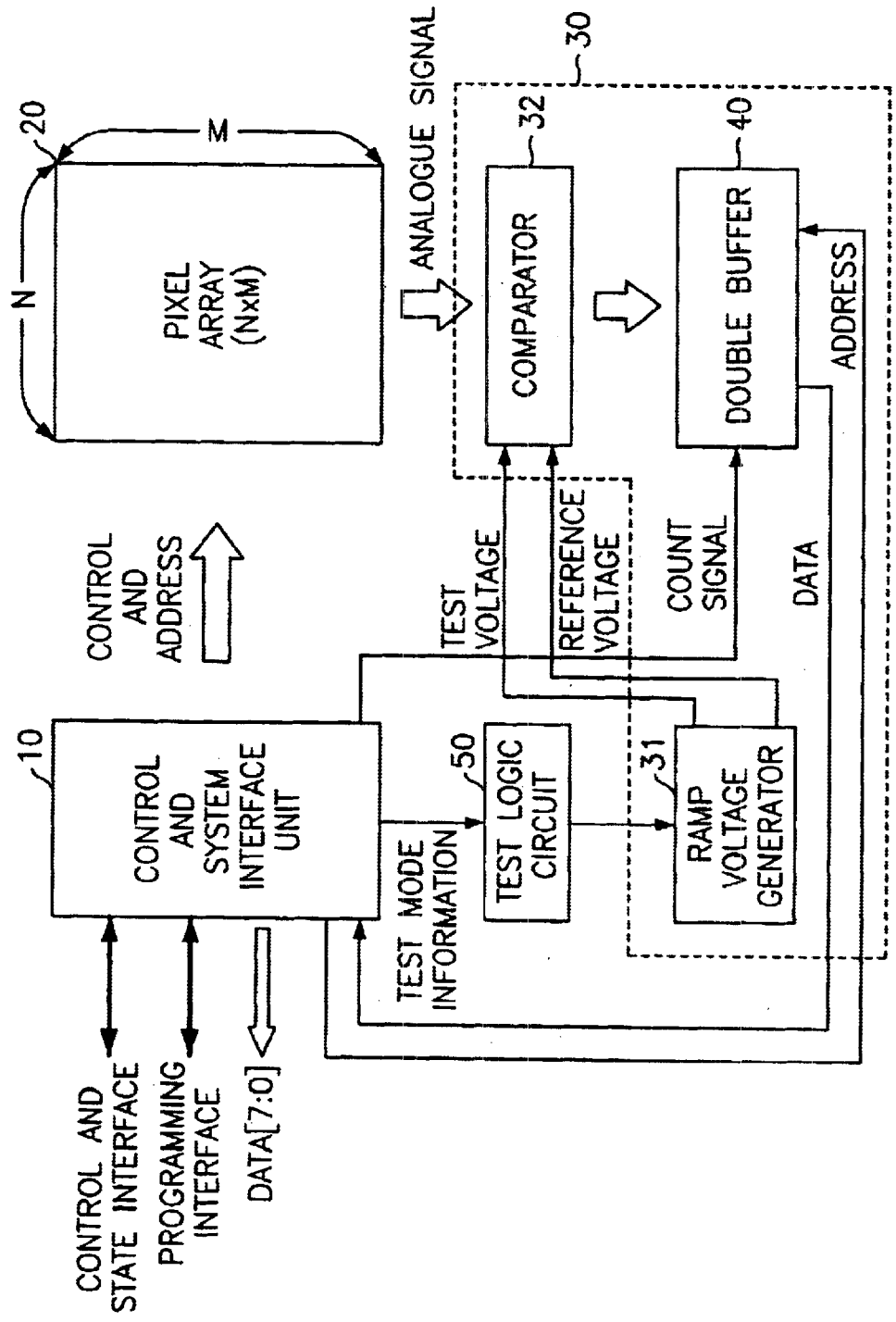
FIG. 1 is a block diagram illustrating a CMOS image sensor according to the present invention.

First, referring to FIG. 1, a CMOS image sensor according to the present invention includes a control and interface unit 10, a pixel array 20 having a plurality of CMOS image sensing elements, a single slope AD converter 30 and a test logic circuit 50 for verifying an operation of the CMOS image sensor. The single slope AD converter 30 also includes a ramp voltage generator 31 for generating a reference voltage and a test voltage, a comparator (operational amplifier) 32 for comparing the ramp voltage with an analogue signal from the pixel array 20 and a double buffer 40.

The control and interface unit 10 controls the CMOS image sensor in FIG. 1 by controlling an integration time, scan addresses, operation modes, a frame rate, a bank and a clock division using a FSM (Finite State Machine) and acts as an interface with an external system. The control and interface unit 10 will be described in detail in the following FIG. 2.

The pixel array 20 consisting of N×M unit pixels having excellent light sensitivity senses an image from an object. Each pixel of the pixel array 20 includes a transfer transistor, a reset transistor and a select transistor.

The single slope AD converter 30 converts analogue signals from the pixel array 20 into digital signals. In the present invention, this AD conversion is carried out by comparing the ramp voltage with the analogue signals. The comparator 32 searches for a point at which the analogue signals are the same as the falling ramp voltage with a predetermined slope. When the ramp voltage is generated and then starts falling, the control and interface unit 10 generates count signals to count the degree of the voltage drop. For example, the ramp voltage starting the voltage drop, the converted digital value may be "20" in the case where the analogue signals are the same as the falling ramp voltage at 20 clocks of the control.and interface unit 10. This converted digital value is stored in the double buffer 40 as digital data. The establishment of the digital value will be described in detail in the following FIG. 4.

The present invention includes within the chip the test logic circuit 50 for effectively verifying an error which can be caused by this digital conversion.

Figure 2:
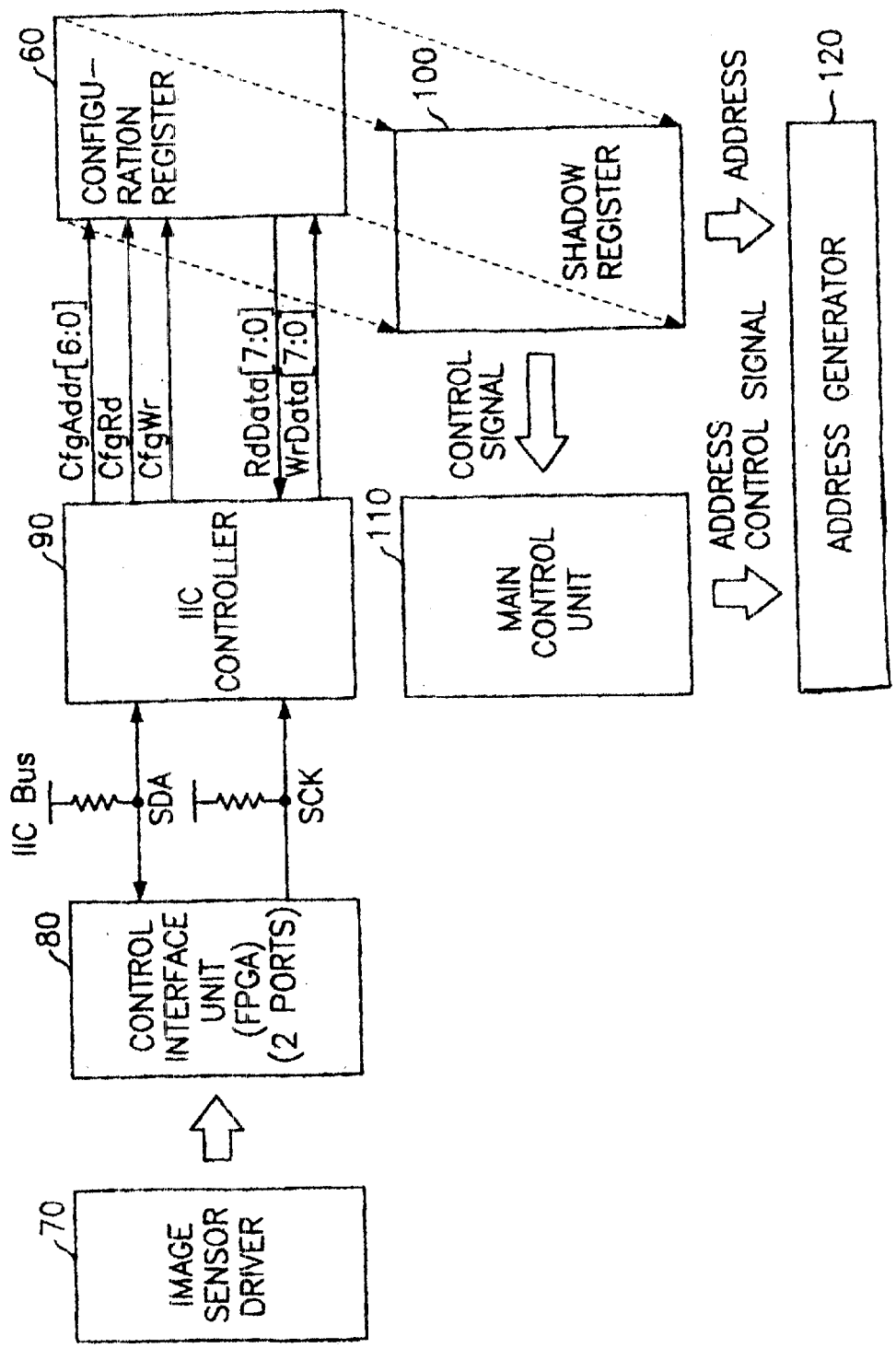
FIG. 2 is a block diagram illustrating a control and system interface unit of FIG. 1.

Referring to FIG. 2 illustrating the control and system interface unit 10 of FIG. 1, since the control and system interface unit includes a plurality of configuration registers (or user visible register) 60 which can be programmed by the users, it is possible to control various operations according to the request from the users. The operations of the CMOS image sensor according to the present invention are programmed by an IIC (inter integrated circuit) bus interface unit. When an image sensor driver 70 sends program information to an IIC control unit 90 through a control interface unit 80, for example, FPGA (Field Programmable Gate Array), the IIC control unit 90, which is synchronized with system clock signals, receives the program information via a bus and interprets the program information according to IIC bus protocols, thereby controlling the configuration registers 60.

The programming between the image sensor driver 70 and the CMOS image sensor is performed by the configuration registers 60 in which read and write operations are already available. In the CMOS image sensor according to the present invention, the programmed information can be updated in a frame basis and this update is carried out by a specific register, i.e., a shadow register 100. The shadow register 100 duplicates the information stored in the configuration registers 60 and makes it possible to change the configuration registers 60 in a scene basis, only when a sensor enable signal (supplied from an external circuit) is in a high level or there is information to be updated in the configuration registers 60 at the beginning of each frame. This shadow register 100 prevents a picture from being broken or upset by an interruption of users' instructions.

To control the CMOS image sensor, the shadow register 100 includes a basic information register to store the size and version of the CMOS image sensor, an operation mode register to store operation modes, a window control register to store information associated with row and column starting addresses and the size and area of the window, a frame rate adjusting register to adjust the terms of HSYNC (Horizontal Synchronization Signal) and VSYNC (Vertical Synchronization Signal) and a rate of clock division and an adjustment register to adjust a reset level and color (red, green and blue) gain.

A main controller 110 controls each element of the CMOS image 10 sensor according to the information stored in the shadow register 100 and an address generator 120 creates the addresses for the pixel array 20 and the double buffer 40.

Figure 3:
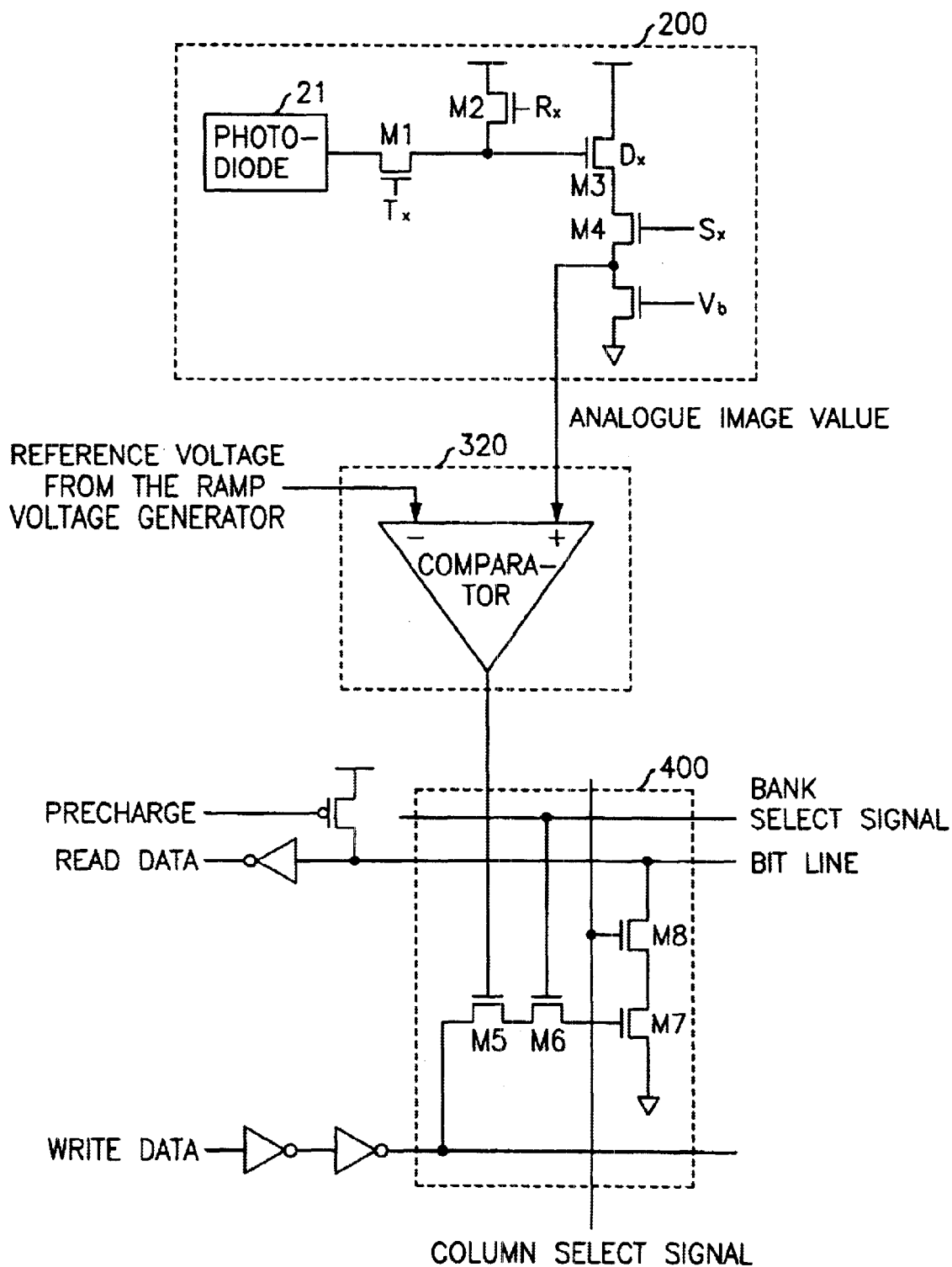
FIG. 3 is a circuit diagram illustrating a CMOS image sensor core according to the present invention.

Referring to FIG. 3, a CMOS image sensor core according to the present invention includes a unit pixel 200, a comparator 320 and a unit latch circuit 400. The unit pixel 200 includes a photodiode 21 generating electron-hole pairs and four NMOS transistors M1 to M4. The charges generated in the photodiode 21 are transferred to a floating junction (FD) when the transfer transistor M1 is turned on and a voltage change occurs at the floating junction as a function of generated charges based on the equation V=Q/C. The time when the transfer transistor M1 is turned off is an integration time corresponding to the time of exposure in an optical instrument.

The reset transistor M2 relates to the correlated double sampling (hereinafter, referred to as a CDS). If the reset transistor M2 is turned on and the transfer transistor M1 is turned off, the floating junction may be charged to a rest voltage. Accordingly, the voltage corresponding to the reset level can be obtained by detecting the voltage at the floating junction on the above conditions. When the reset transistor M2 is turned off and the transfer transistor M1 is turned on, the charges generated in the photodiode 21 are transferred to the floating junction and then the voltage at the floating junction is a data level. An offset, which is caused by the unit pixel 200 and the comparator 320, may be removed by subtracting the data level from the reset level. This removal of the offset is essential to the CDS. That is, by removing an unexpected voltage in the unit pixel 200, it is possible to obtain a net image data value.

Figure 4:
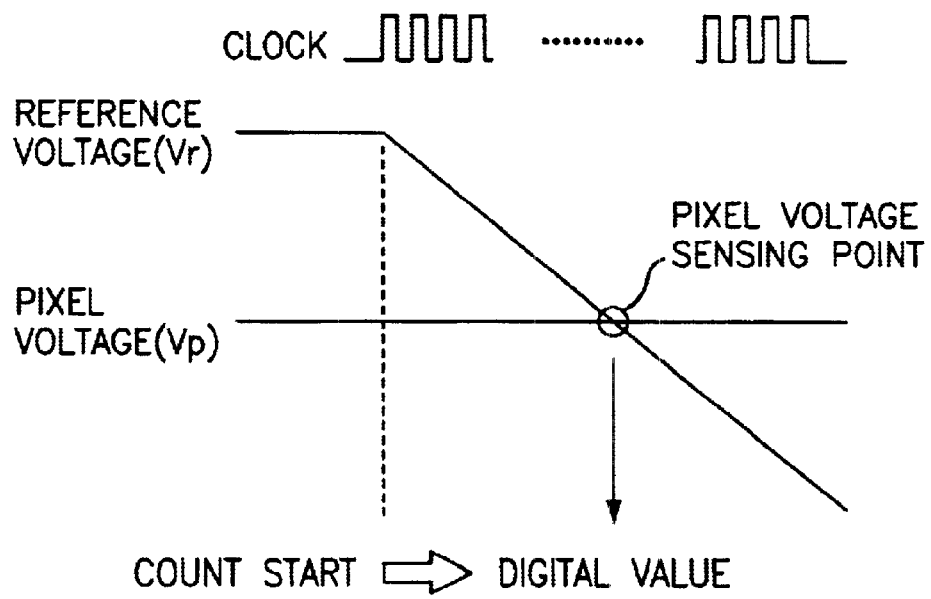
FIG. 4 is a plot illustrating an operation of a comparator and a double buffer according to the present invention.

Referring to FIG. 4, the digital value is obtained by comparing the ramp voltage from the ramp voltage generator 31 with the analogue signal from the pixel. It is well-known to those skilled in the art that there are various methods in the analogue-to-digital conversions. In the present invention, a single slope AD conversion is used and the final digital values are produced by the comparator 32 and the double buffer 40. The ramp voltage generator 31 generates a voltage of which amount is dropped in a predetermined slope every clock and this falling ramp voltage as a reference voltage is compared with the analogue signal (or pixel voltage) from the pixel. The initial value of the ramp voltage may be set to a appropriate level which is more than the expected maximum analogue signal or by users. The control and interface unit 10 counts with the clock synchronization until the analogue signal is the same as the falling ramp voltage. If such a pixel voltage sensing point is detected, the control and interface unit 10 writes a corresponding count signal (digital value) into the double buffer 40.

Referring again to FIG. 3, the unit latch circuit 400 includes four NMOS transistors M5 to M8. The transistor M5 is turned on in response to the output from the comparator 320 (so, the output from the comparator 320 is called an "write enable signal") and the transistor M6 is turned on in response to a bank select signal which selects one of buffer groups within the double buffer 40 in FIG. 7. When the corresponding buffer group is selected and then the transistor M6 is turned on, the transistor M5 is turned on if the reference voltage is more than the pixel voltage. If the transistors M5 and M6 are turned on, the count signal is applied to a gate of the capacitive transistor M7 to store data. If the transistor M8 is turned on in response to a column select signal from the control and interface unit 10, the data (count signal) stored in the capacitive transistor M7 is read out through a single-ended bit line having a precharge mean.

On the other hand, if the reference voltage is less than the pixel voltage, the count signal may be not stored in the unit latch circuit 400 because the transistor M5 is turned off, thereby storing the final count signal as a digital value. The counter is positioned within the control and interface unit 10 and the count signal is digital data from a code converter, such as a gray code converter.

Figure 5:
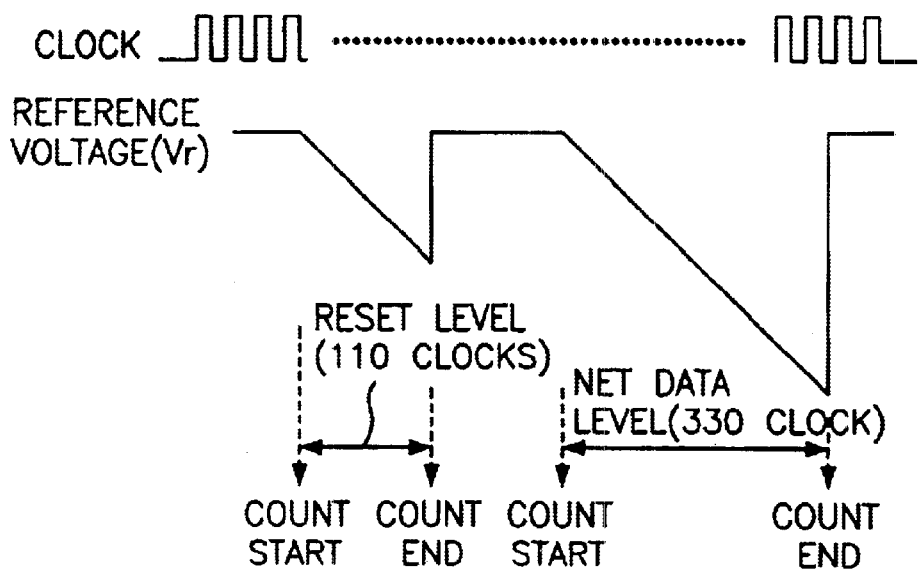
FIG. 5 is a timing chart illustrating the removal of an offset generated in the CMOS image sensor.
Figure 6:
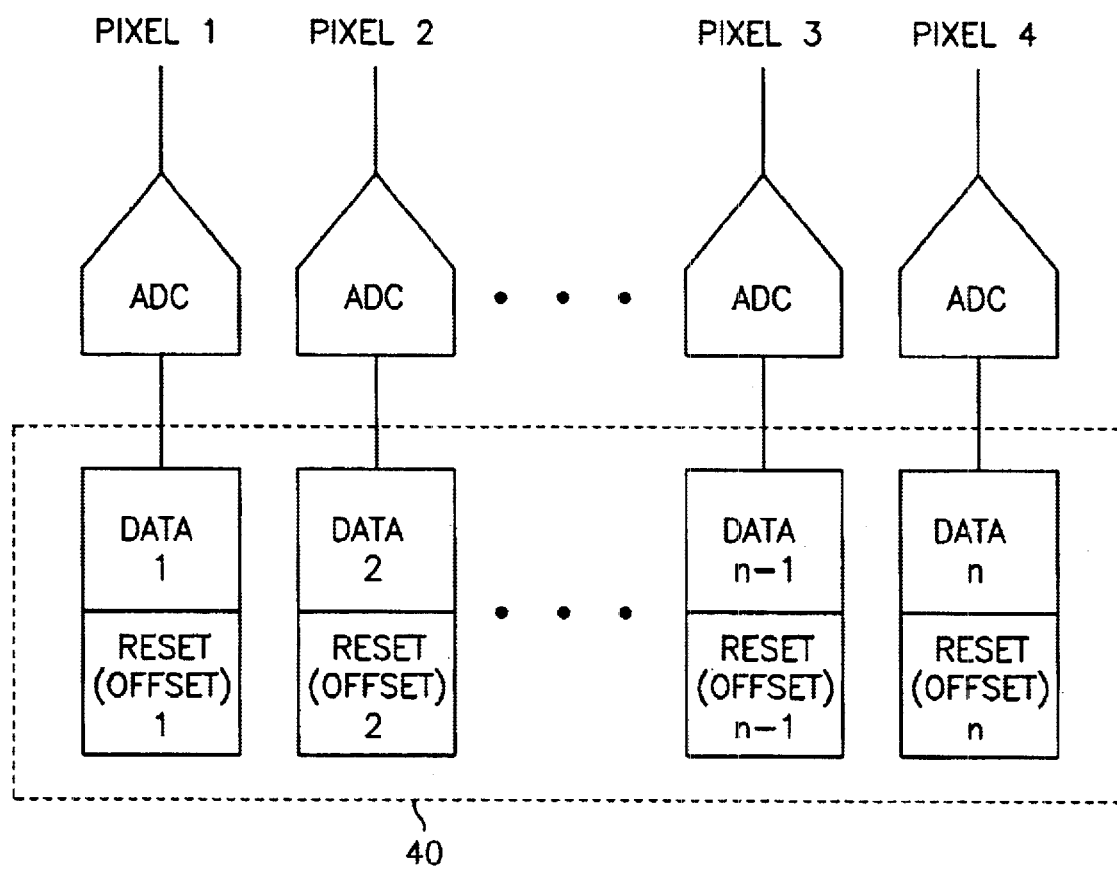
FIG. 6 is a block diagram illustrating a write operation in the double buffer

Referring to FIG. 5, an offset generated in the CMOS image sensor is removed. In FIG. 5, the first slope is used for reading out a voltage (referred to as a reset voltage) generated when the reset transistor M2 in the unit pixel 200 is turned on. Also, the second slope is used for reading out a voltage (referred to as a data voltage) when the analogue signal is outputted from the pixel. So, the double buffer 40 according to the present invention includes two buffers, each of which has two memory banks (or groups). A first memory bank is used for storing the offsets and a second memory bank for storing the digital values. For example, if the reset voltage is counted as a digital value of 110 and the data voltage is counted as a digital value of 440, the net digital value caused by an image is "330 (440–110)." FIG. 6 shows a structure of such a double buffer. In the conventional CDS methods, it is required that additional circuits must be added to the image sensors. However, since such an additional circuit also causes a new offset, it is very difficult to design circuits for making a complete removal of the offset. In the present invention, since the net digital value caused by an image is obtained after the reset voltage is converted into a digital value as shown in FIG. 5, the circuit design for CDS may be easily done.

Figures 7, 8:
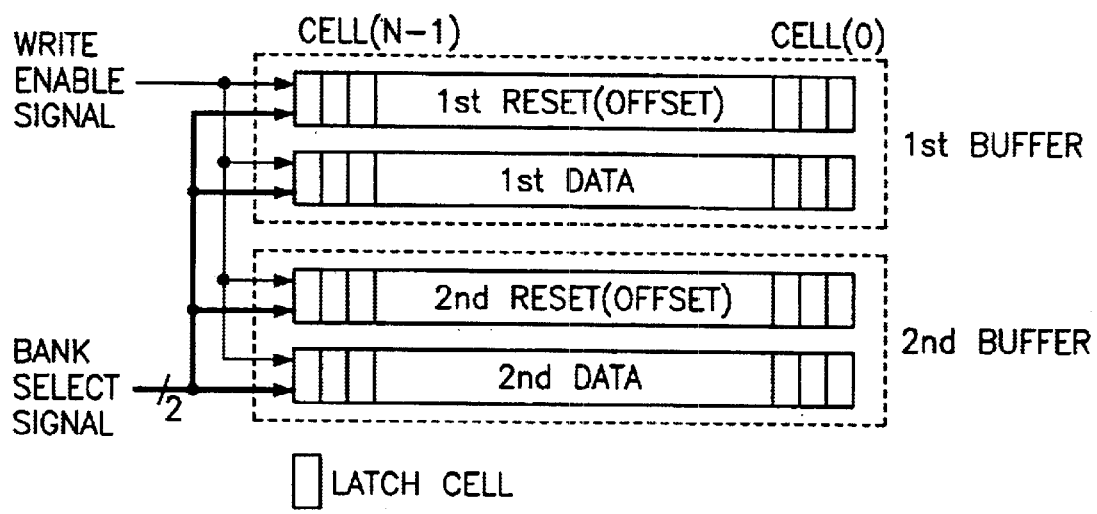
FIG. 7 is a block diagram illustrating a latch cell array of the double buffer.
FIG. 8 is a memory block diagram illustrating a test mode register according to the present invention.

As shown in FIG. 7, the double buffer 40 according to the present invention includes two buffers, each of which has two memory banks, in order to implement a pipeline structure in which the write and read operations are simultaneously carried out. The write operation may be carried out in the first buffer during the read operation at the second buffer. Cells in the buffers have 8 unit latch circuits (in the case of 8 bit data processing image sensor having N×M pixels). Accordingly, the number of total cells is N×8×4.

The pipelined double buffer makes it possible to read out data asynchronously, providing improvements of an interface and a transmission rate. In particular, the asynchronous interface is prerequisite to the high transmission rate. By employing the double buffer in the CMOS image sensor, a various subsampling can be easily achieved by alternatively selecting even or odd cells and by selecting one of three or four cells. Furthermore, with the increase of the number of line buffer, it is possible to apply two-dimensional image data block to the CMOS image sensor without additional buffers. In the case of the parallel AD converters, the double buffer according to the present invention may be essentially needed.

The test logic circuit 50 is applied for heightening the verification by easily sensing the misfunction of the CMOS image sensor even though it is not essential element in construction of image sensor.

The configuration registers 60 of the control and interface unit 10 include a mode setting Register which is controlled by a programming interface and a test mode according to the present invention is set through such a mode setting Register. In the case of the mode change, the test logic circuit 50 operates based on the changed mode.

Referring to FIG. 8, the mode setting register initializes the CMOS image sensor at a normal mode and it is programmable to be changed to three test modes according to the kinds of test. Three test modes according to the present invention are as follows: 1) $Test_{13}$ A Mode used in monitoring the operation state of FSM of the control and interface unit and used in sensing the misfunction of the control logic circuits and the programming interface; 2) $Test_{13}$ B Mode used in detecting errors generated from the comparator, but employing the ramp voltage generator; and 3) $Test_{13}$ C Mode used in detecting stuck-at-faults for latch cells in the double buffer 40, by repeatedly writing and reading predetermined digital data patterns.

The test results are outputted through the data bus (DATA[7:0]) of FIG. 1. All digital data read out from the sensing pixels are outputted to the same data bus in the normal mode, but it is not necessary to add an additional pin for reading out the test results of the test modes because the results of the test modes and the data from the pixels can be selectively outputted by a multiplexer.

The $Test_{13}$ A Mode is for testing the misfunction of the control and interface unit and outputs the values of FSM which plays a pivotal role in the controllers therein, instead of outputting the digital values from the pixels through the data bus. The values of FSM are variously changed according to the states of an internal control logic circuit and that of an external control pin. Accordingly, it is possible to test the misfunction of the control and interface unit by monitoring only the changes of values of FSM.

Figure 9:
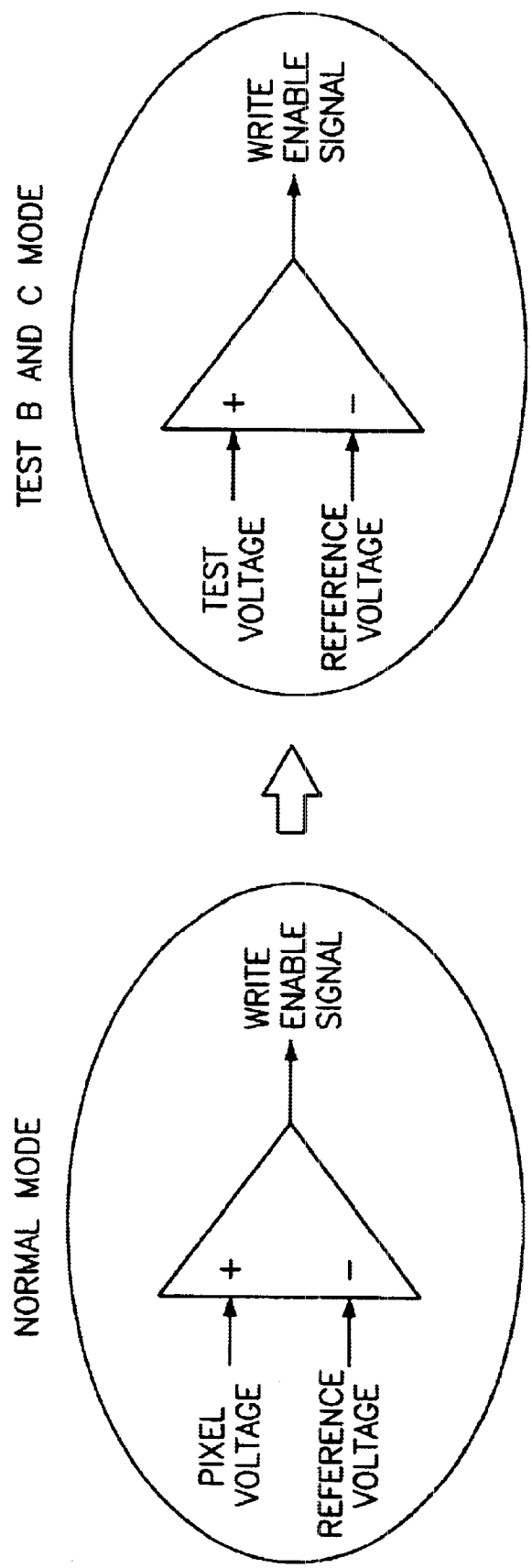
FIG. 9 is a block diagram illustrating the comparator in normal and test modes according to the present invention.

$Test_{13}$ B is mainly for testing the voltage comparator. As shown in FIG. 9, the comparator is a portion to play a significant role of converting analogue signals sensed from the pixels to digital signals.

This invention, as shown in FIG. 9, generates from the ramp voltage generator two given input voltages entering the comparator in the $Test_{13}$ B Mode, instead of unknown voltage from the pixel. At this point, the reference voltage is a ramp voltage linearly decreased according to the same clock as the normal mode and the test voltage is an intentional and expectable fixed voltage for testing the function of the comparator.

Figure 10:
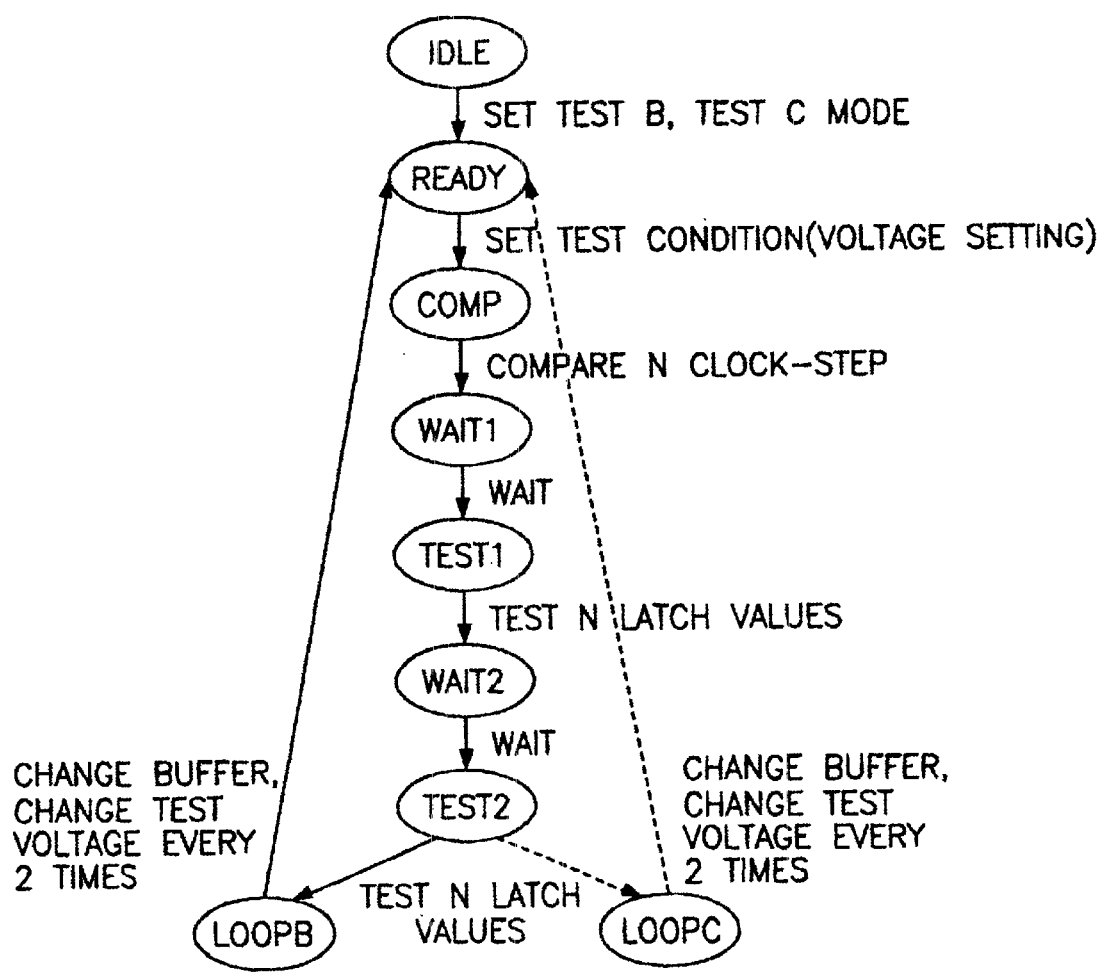
FIG. 10 is a state diagram illustrating a test mode according to the present invention.

Referring to FIG. 10 illustrating the FSM for the $Test_{13}$ B Mode and the $Test_{13}$ C Mode, the states are as follows:

IDLE: State where the $Test_{13}$ B Mode and $Test_{13}$ C Mode are not set up;

READY: State where the test voltage is set up and the number of test is outputted through the output pin (DATA[7:0]), preparing each test in the $Test_{13}$ B Mode and the $Test_{13}$ C Mode;

COMP: State where the test voltage prepared at the READY state is compared with the reference voltage, the compared results are written in the latch cells of the double buffer and digital values stored in the latch cell are outputted to the output pin (DATA[7:0]);

WAIT1: State where "00H" notifying the comparison of the reset latch cells is outputted, preparing to read out data in the reset latch cells array to support the CDS;

TEST1: State outputting the digital values stored in the reset latch cells through the output pin (DATA[7:0]), which must be the same as those outputted at the COMP state;

WAIT2: State where "ffH" notifying that the digital values corresponding to the data latch cells are outputted next is outputted through the output pin;

TEST2: State outputting the digital values corresponding to the data latch cells, which must be the same as those outputted at the COMP state;

LOOPB: State comprising the steps of: repeatedly carrying out the above states for another buffer; changing the test voltage after finishing test for two buffers; and turning to the READY state and repeatedly carrying out the test; and LOOPC: State for the $Test_{13}$ C Mode. Similar to the $Test_{13}$ B Mode, the $Test_{13}$ C Mode finishes the test for two buffers and changes the predetermined digital data patterns as explained below.

The test voltage is for testing the function of the comparator. The test voltage having difference of one fourth rather than the resolution of the comparator; that is, having 6 bit resolution, considering the complexity and characteristic of is circuits for it, is more effective.

The Test$_{13}$ C Mode is mainly for examining latch cells in the double buffer. As shown in FIG. 7, in case a buffer line is composed of N latch cells per 1 line, the double buffer comprises 8×2×2×N latch cells because it has 8 bit value and the more N values are increased, the more possibility to generate errors there may be.

In the normal mode, as shown in FIG. 4, the counter values of the result of comparing the analogue signal with the reference signal in the comparator are stored in the double buffer. Thus, in case any error generates in the double buffer, extraordinary results can be obtained even if the pixels, comparator and counter function well.

The Test$_{13}$ C Mode, different from the Test$_{13}$ B Mode, is to search for errors which may be generated in the latch cells. Therefore, a read/write interface for testing only the double buffer may bring out much costs. Thus, in the present invention, the Test$_{13}$ C Mode is carried out, using the normal mode or the Test$_{13}$ B Mode itself.

Figure 11:
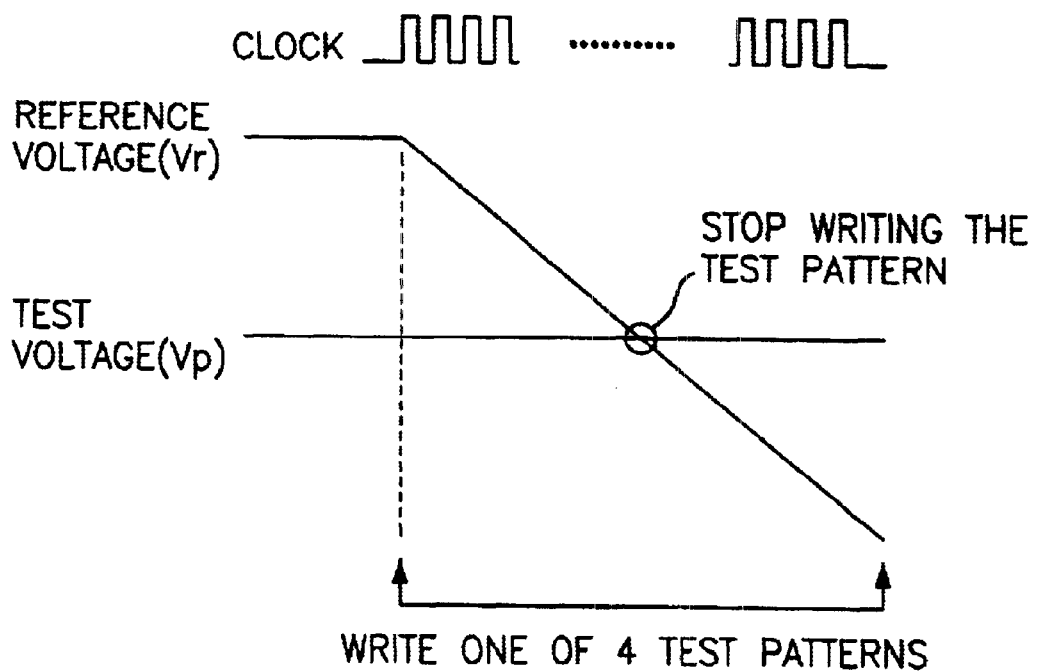
FIG. 11 is a state diagram illustrating the comparator and the double buffer at a test mode.

As shown in FIG. 11, an arbitrary voltage which is higher than the lowest point of and lower than the highest point of a reference ramp voltage is established as a test voltage in order for it to provide the write enable signal for the double buffer. Until the test voltage is higher than reference voltage, the write enable signal is produced.

The count values are stored in the normal mode and the Test$_{13}$ B Mode, being synchronized with the ramp voltage. However, in the Test$_{13}$ C Mode, predetermined digital data patterns instead of the count values are repeatedly used until the write enable signal is OFF, to easily find out stuck-at-fault. The predetermined digital data patterns according to the present invention are as follows:

11111111
00000000
10101010
01010101

The above patterns are in this order changed when FSM of FIG. 10 finishes the "LOOPC" state for the two buffers.

As apparent from the above, the CMOS image sensor according to the present invention is effectively implemented on one chip on which all the circuits necessary is formed with a low power consumption and the function of each circuit can.be simply tested.

While the present invention has been described with respect to certain preferred embodiments only, other modification and variation may be made without departing from the spirit and scope of the present invention as set forth in the following claims

What is claimed is:

1. A CMOS image sensor comprising:
   a control/interface means for controlling the CMOS image sensor and outputting test mode information according to a request from a user by using a state machine;
   a pixel array including a plurality of pixels sensing images from an object and generating analogue signals according to an amount of incident light;
   a conversion means for converting the analogue signals into digital signals to be processed in a digital logic circuit; and
   a logic circuit for testing misfunction of the conversion means and the control/interface means, in response to the test mode information.

2. The CMOS image sensor as recited in claim 1, wherein the control/interface means comprises a user invisible register.

3. The CMOS image sensor as recited in claim 2, wherein the control/interface means comprises a plurality of configuration registers which are user visible registers and wherein the configuration registers comprise a test mode register.

4. The CMOS image sensor as recited in claim 3, wherein the conversion means comprises:
   a voltage generator for generating first and second reference voltages and for generating a test voltage in response to a control signal from the logic circuit;
   a comparison means for comparing the analogue signals with the first reference voltage in a normal mode and for comparing the second reference voltage with the test voltage in a test mode, wherein the normal and test modes are determined by the test mode register of the configuration registers; and
   a storage means for storing count signals from the control/interface means in response to outputs from the comparison means.

5. The CMOS image sensor as recited in claim 4, wherein the storage means has a pipelined structure, including first and second buffers, each of which has first and second memory banks, wherein the first memory bank stores offset values generated in the CMOS image sensor and the second memory stores data values from the pixel array.

6. The CMOS image sensor as recited in claim 4, wherein the logic circuit controls the voltage generator for providing the comparison means with the first reference voltage in the normal mode and for providing the comparison means with the test voltage and second reference voltage in the test mode.

7. The CMOS image sensor as recited in claim 4, wherein the test mode register stores first information for testing the misfunction of the state machine of the control/interface means, second information for testing the misfunction of the comparison means and third information for testing the misfunction of the storage means.

8. The CMOS image sensor as recited in claim 4, wherein the count signals are digital signals generated in a code converter.

9. The CMOS image sensor as recited in claim 4, wherein the storage means is asynchronously interfaced with the control/interface means.

10. The CMOS image sensor as recited in claim 5, wherein the storage means comprises a plurality of latch circuits, the latch circuit including:
    a first transistor receiving the count signals in response to a control signal from the comparison means;
    a second transistor for transferring an output of the first transistor in response to a bank select signal which selects one from the first and second memory banks;
    a third transistor for storing the count signals in response to an output of the second transistor; and
    a fourth transistor for transferring the data stored in the third transistor to a bit line in response to a column signal from the control/interface means.

11. The CMOS image sensor as recited in claim 6, wherein the CMOS image sensor further comprises a multiplexer for selecting outputs of the storage means in the normal or test mode.

12. The CMOS image sensor as recited in claim 10, wherein the pixel array has N×M pixels, wherein the comparison means has N operational amplifiers and wherein the storage means has 4×(the number of bit to be processed)×N latch circuits.

13. The CMOS image sensor as recited in claim 3, wherein the user invisible register stores contents of the configuration register which is being processed.

14. A CMOS image sensor having a pixel array to output analogue signals sensed from an object, the CMOS image sensor comprising:

an analogue-to-digital converter including:
 a) a voltage generator for generating a first reference voltage;
 b) a comparison means for comparing the analogue signals with the reference voltage; and
 c) a storage means for storing digital signals in response to outputs form the comparison means; and a logic circuit for detecting whether the analogue-to-digital converter operates erroneously or not, wherein the logic circuit operates in response to test mode information stored in a mode register which the CMOS image sensor has, controls the voltage generator for the comparison means to receive a second reference voltage and a test voltage and stores in the storage means digital signals produced in response to a control signal from the comparison means, and wherein the storage means outputs the stored digital signals to an output terminal of the CMOS image sensor.

15. The CMOS image sensor as recited in claim 14, wherein the CMOS image sensor comprises a user invisible register.

16. The CMOS image sensor as recited in claim 15, wherein the CMOS image sensor comprises a plurality of configuration registers which are user visible registers and wherein the configuration registers comprise a test mode register.

17. The CMOS image sensor as recited in claim 16, wherein the user invisible register stores contents of the configuration register which is being processed.

18. The CMOS image sensor as recited in claim 14, wherein the CMOS image sensor further comprises a multiplexer for selecting outputs of the storage means in a normal or test mode.

19. The CMOS image sensor as recited in claim 14, wherein the storage means has a pipelined structure, the storage means is including first and second buffers, each of which has first and second memory banks, wherein the first memory bank stores offset values generated in the CMOS image sensor and the second memory bank stores data values from the pixel array.

20. The CMOS image sensor as recited in claim 14, wherein the digital signals are count signals produced by a code converter.

21. The CMOS image sensor as recited in claim 19, wherein the storage means comprises a plurality of latch circuits, the latch circuit including:

a first transistor receiving the count signals in response to a control signal from the comparison means;

a second transistor for transferring an output of the first transistor in response to a bank select signal which selects one from the first and second memory banks;

a third transistor for storing the count signals in response to an output of the second transistor; and a fourth transistor for transferring the data stored in the third transistor to a bit line in response to a column signal.

22. The CMOS image sensor as recited in claim 14, wherein the pixel array has N×M pixels, wherein the comparison means has N operational amplifiers and wherein the storage means has 4×(the number of bit to be processed)×N latch circuits.

23. The CMOS image sensor as recited in claim 14, wherein the storage means is asynchronously interfaced with external circuits outside thereof.

* * * * *